United States Patent
Guo et al.

(10) Patent No.: US 11,196,021 B2
(45) Date of Patent: Dec. 7, 2021

(54) COMPOSITE FILM LAYER, HAVING ALTERNATELY-STACKED SUB-FILM LAYERS WITH DIFFERENT REFRACTIVE INDEXES

(71) Applicant: WUHAN CHINA STAR OPTOELECTRONICS SEMICONDUCTOR DISPLAY TECHNOLOGY CO., LTD., Hubei (CN)

(72) Inventors: Tianfu Guo, Hubei (CN); Hsianglun Hsu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 537 days.

(21) Appl. No.: 16/097,942

(22) PCT Filed: Aug. 31, 2018

(86) PCT No.: PCT/CN2018/103621
§ 371 (c)(1),
(2) Date: Oct. 31, 2018

(87) PCT Pub. No.: WO2020/029351
PCT Pub. Date: Feb. 13, 2020

(65) Prior Publication Data
US 2021/0226159 A1     Jul. 22, 2021

(30) Foreign Application Priority Data

Aug. 10, 2018   (CN) .......................... 201810911262.1

(51) Int. Cl.
*H01L 51/52*     (2006.01)
*H01L 27/32*     (2006.01)
(Continued)

(52) U.S. Cl.
CPC ...... *H01L 51/5253* (2013.01); *H01L 27/3244* (2013.01); *H01L 51/0097* (2013.01);
(Continued)

(58) Field of Classification Search
CPC ............ H01L 51/5253; H01L 27/3244; H01L 51/0097
See application file for complete search history.

(56) References Cited

U.S. PATENT DOCUMENTS 7,629,739 B2 *   12/2009   Han .................... H01L 51/5253
                                                                      313/504
7,903,338 B1 *   3/2011   Wach ................... A61B 5/0084
                                                                      359/588
(Continued)

FOREIGN PATENT DOCUMENTS

CN           1631058 A      6/2005
CN       102157543 A      8/2011
(Continued)

*Primary Examiner* — Michael Jung (57) ABSTRACT

A composite film layer, a method for manufacturing the same, and a method for manufacturing an organic light emitting diode (OLED) display panel are provided. The composite film layer includes first sub-film layers and second sub-film layers having different refractive indices, wherein the first sub-film layers and the second sub-film layers are alternately stacked, and thicknesses of the first sub-film layer and thicknesses of the second sub-film layer gradually increase or decrease in a direction perpendicular to the composite film layer.

6 Claims, 6 Drawing Sheets

(51) Int. Cl.
*H01L 51/56* (2006.01)
*H01L 51/00* (2006.01)

(52) U.S. Cl.
CPC ........ *H01L 51/56* (2013.01); *H01L 2227/323* (2013.01); *H01L 2251/5338* (2013.01); *H01L 2251/558* (2013.01)

(56) References Cited

U.S. PATENT DOCUMENTS

| | | | |
|---|---|---|---|
| 10,312,473 | B2 | 6/2019 | Kim et al. |
| 2005/0146266 | A1 | 7/2005 | Kuma et al. |
| 2006/0290844 | A1* | 12/2006 | Epstein ............. G02F 1/133615 349/113 |
| 2007/0267973 | A1* | 11/2007 | Suh .................... H01L 51/5221 313/512 |
| 2008/0197518 | A1* | 8/2008 | Aylward ............. G02B 5/3083 264/1.34 |
| 2009/0021157 | A1 | 1/2009 | Kim et al. |
| 2013/0037792 | A1 | 2/2013 | Kim et al. |
| 2013/0302627 | A1* | 11/2013 | Roehrig ................ H01L 23/296 428/447 |
| 2018/0183007 | A1* | 6/2018 | Magno ................... C30B 29/54 |
| 2019/0072718 | A1* | 3/2019 | Ouderkirk ............ G02B 6/0065 |
| 2019/0324179 | A1* | 10/2019 | Thyagarajan ........... C23C 16/06 |

FOREIGN PATENT DOCUMENTS

| | | |
|---|---|---|
| CN | 105353430 A | 2/2016 |
| CN | 106450026 A | 2/2017 |

\* cited by examiner

COMPOSITE FILM LAYER, HAVING ALTERNATELY-STACKED SUB-FILM LAYERS WITH DIFFERENT REFRACTIVE INDEXES

FIELD OF INVENTION

The present disclosure relates to the technical field of display, and in particular to a composite film layer, a method for manufacturing the same, and a method for manufacturing organic light emitting diode (OLED) display panel.

BACKGROUND OF DISCLOSURE

An organic light emitting diode (OLED) has excellent characteristics, such as self-luminance, low power consumption, wide viewing angles, color richness, fast response times, etc, and may be used to prepare a flexible display. OLEDs have therefore attracted great interest from scientific research community and industry, and are considered to be a potential next-generation technology.

Current OLED screens that are widely used in the display field generally employ a top-emitting structure. The OLED apparatus is composed of anodes, an organic layer, and cathodes. The organic material layer includes a hole injection layer, a hole transport layer, an organic light emitting layer, an electron transport layer, and an electron injection layer.

Because the organic light emitting layer and the cathodes are sensitive to water and oxygen, it is particularly important to prevent water and oxygen from entering the organic light emitting layer in the OLED apparatus. Moreover, ultraviolet radiation may also greatly shorten life of the organic light emitting layer of the OLED apparatus. Therefore, a encapsulation portion outside the OLED apparatus is required to block water and oxygen from entering the organic light emitting layer, as well as effectively prevent ultraviolet radiation damage to the organic light emitting layer in the OLED apparatus. Therefore, there is an urgent need for an OLED display panel which is able to effectively block water and oxygen as well as ultraviolet radiation.

SUMMARY OF INVENTION

The present disclosure provides a composite film layer, a method for manufacturing the same, and a method for manufacturing organic light emitting diode (OLED) display panel for resolving the problem that the encapsulation portion outside the OLED apparatus is not able to block ultraviolet radiation.

To achieve the above object, the technical solution provided by the present disclosure is as follows:

In accordance with an aspect of the disclosure, a composite film layer is provided, which includes first sub-film layers and second sub-film layers, wherein a refractive index of the first sub-film layers is different from a refractive index of the second sub-film layers, the first sub-film layers and the second sub-film layers are alternately stacked, and thicknesses of the first sub-film layers and thicknesses of the second sub-film layers gradually increase or decrease in a direction perpendicular to the composite film layer.

In accordance with an embodiment of the disclosure, the first sub-film layers and the second sub-film layers are inorganic layers.

In accordance with an embodiment of the disclosure, the first sub-film layers and the second sub-film layers are organic layers.

In accordance with an embodiment of the disclosure, the first sub-film layers are organic layers and the second sub-film layers are inorganic layers.

In accordance with an embodiment of the disclosure, the thicknesses of the first sub-film layers and the thicknesses of the second sub-film layers are all greater than 50 nm and less than 200 nm.

In accordance with an embodiment of the disclosure, an absolute value of a difference between the refractive index of the first sub-film layer and the refractive index of the second sub-film layer is greater than or equal to 0.4.

In accordance with an aspect of the disclosure, a method for manufacturing a composite film layer for encapsulating an OLED layer, comprising steps of:

(S11) selecting first sub-film layers and second sub-film layers, wherein a refractive index of the first sub-film layers is different from a refractive index of the second sub-film layers; and (S12) alternately depositing and stacking coatings of the first sub-film layers and the second sub-film layers to prepare the composite film layer;

wherein thicknesses of the first sub-film layers and thicknesses of the second sub-film layers gradually increase or decrease in a direction perpendicular to the composite film layer.

In accordance with an embodiment of the disclosure, step S12 specifically includes: controlling coating durations of the first sub-film layers and the second sub-film layers to make the thicknesses of sub-film layers and the thicknesses of the second sub-film layers increase or decrease in a gradient in a direction perpendicular to the composite film layer.

In accordance with an embodiment of the disclosure, the thicknesses of the first sub-film layers and the thicknesses of the second sub-film layers are all greater than 50 nm and less than 200 nm.

In accordance with an embodiment of the disclosure, an absolute value of a difference between the refractive index of the first sub-film layer and the refractive index of the second sub-film layer is greater than or equal to 0.4.

In accordance with an embodiment of the disclosure, a method for manufacturing an organic light emitting diode (OLED) display panel, including the method for manufacturing the composite film layer as claimed in claim 7, comprising steps of:

(S21) providing a glass substrate, and forming a flexible substrate layer on a surface of the glass substrate;

(S22) forming a thin film transistor layer on a surface of the flexible substrate layer;

(S23) forming an OLED layer on a surface of the thin film transistor layer;

(S24) providing the composite film layer and covering the OLED layer on the thin film transistor layer using the composite film layer, wherein the composite film layer at edges is in contact with the thin film transistor layer;

(S25) forming an organic layer covering the composite film layer on a surface of the composite film layer, wherein the organic layer at edges is in contact with the thin film transistor layer; and (S26) forming an inorganic layer covering the organic layer on a surface of the organic layer, wherein the inorganic layer at edges is in contact with the thin film transistor layer.

The advantage of the present disclosure is that: in the composite film layer, the method for manufacturing the same, and the method for manufacturing the OLED display panel, the resistance of the OLED display panel to ultraviolet radiation is improved by preparing the novel composite film layer having the function of blocking ultraviolet radiation, thereby improving the product quality of the OLED display panel.

BRIEF DESCRIPTION OF DRAWINGS

In order to more clearly illustrate the embodiments of the present invention or the technical solutions in prior arts, the following briefly introduces the accompanying drawings used in the embodiments. Obviously, the drawings in the following description merely show some of the embodiments of the present invention. As regards one of ordinary skill in the art, other drawings can be obtained in accordance with these accompanying drawings without making creative efforts.

DETAILED DESCRIPTION OF PREFERRED EMBODIMENTS

The following description of the embodiments with reference to the accompanying drawings is used to illustrate particular embodiments of the present disclosure. The directional terms referred in the present disclosure, such as "upper", "lower", "front", "back", "left", "right", "inner", "outer", "side surface", etc. are only directions with regard to the accompanying drawings. Therefore, the directional terms used for describing and illustrating the present disclosure are not intended to limit the present disclosure.

The present invention is directed to the problem that the encapsulation portion of the conventional OLED apparatus is not able to block ultraviolet radiation. A composite film layer and a method for manufacturing the same, and a method for manufacturing an OLED display panel are provided to improve the defect in the present embodiment.

Figure 1:
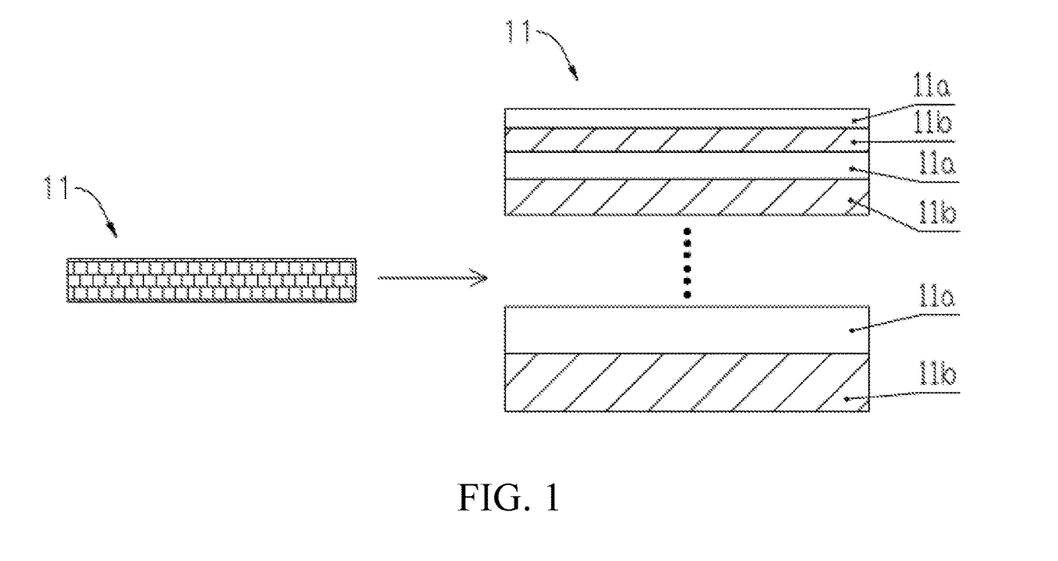
FIG. 1 is a structural schematic diagram of a composite film layer in accordance with an embodiment of the present disclosure.
Figure 2:
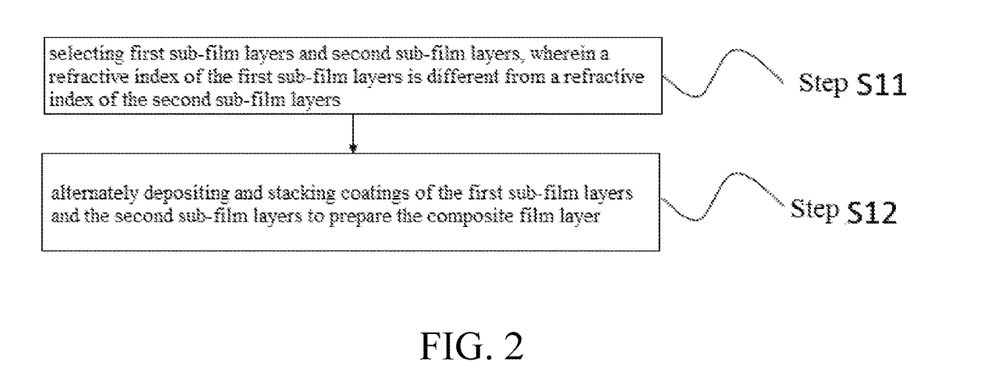
FIG. 2 is a schematic flowchart of a method for manufacturing the composite film layer in accordance with an embodiment of the present disclosure.

The present disclosure is further described below in conjunction with the accompanying drawings and specific embodiments:

FIG. 1 is a structural schematic diagram of a composite film layer in accordance with an embodiment of the present disclosure. FIG. 2 is a schematic flowchart of a method for manufacturing the composite film layer in accordance with an embodiment of the present disclosure.

As shown in FIG. 1, the present disclosure provides a composite film layer 11 including first sub-film layers 11a and second sub-film layers 11b, wherein a refractive index of the first sub-film layers 11a is different from a refractive index of the second sub-film layers 11b, the first sub-film layers 11a and the second sub-film layers 11b are alternately stacked, and thicknesses of the first sub-film layers and thicknesses of the second sub-film layers gradually increase or decrease in a direction perpendicular to the composite film layer.

Preferably, the first sub-film layers 11a and the second sub-film layers 11b are both inorganic layers.

Material of the first sub-film layers 11a is silicon nitride. The refractive index of the silicon nitride is 1.7 to 1.9. Material of the second sub-film layers 11b is silicon oxide. The refractive index of silicon nitride is 1.3 to 1.5.

Preferably, the first sub-film layers 11a and the second sub-film layers 11b are both organic layers.

Preferably, the first sub-film layers 11a are organic layers, and the second sub-film layers 11b are inorganic layers.

When any of the sub-film layers included in the composite film layers 11 is an inorganic layer film, the composite film layer 11 not only functions to block ultraviolet radiation, but also realizes blocking water and oxygen due to the effective resistance of the inorganic layer to water and oxygen, thereby further realizing the protection of the OLED layer. Certainly, the composite film layer 11 includes an inorganic film layer, but is not limited to the inorganic film layer, due to the factors, such as material.

In accordance with another aspect of the present disclosure, as shown in FIG. 2, a method for manufacturing a composite film layer 11 for encapsulating an OLED layer includes:

Step S11: first sub-film layers 11a and second sub-film layers 11b are selected, wherein a refractive index of the first sub-film layers 11a is different from a refractive index of the second sub-film layers 11b.

Specifically, there are three different embodiments for the first sub-film layers 11a and the second sub-film layers 11b.

In an embodiment, neither first sub-film layers 11a nor the second sub-film layers 11b have inorganic layer films.

Furthermore, material of the first sub-film layers 11a is silicon nitride. The refractive index of the silicon nitride is 1.7 to 1.9. Material of the second sub-film layers 11b is silicon oxide. The refractive index of silicon nitride is 1.3 to 1.5.

In another embodiment, the first sub-film layers 11a and the second sub-film layers 11b are both inorganic layer films.

In still another embodiment, the first sub-film layers 11a are organic layer films, and the second inorganic layer 11b are inorganic layer films.

Step S12: coatings of the first sub-film layers and coatings of the second sub-film layers are alternately deposited and stacked to prepare the composite film layer.

Thicknesses of the first sub-film layers and thicknesses of the second sub-film layers gradually increase or decrease from top to bottom.

The purpose of such a design is that due to the film thickness differences and the refractive index difference between the first sub-film layers 11a and the second sub-film layers 11b, a half wave loss phenomenon occurs when light passes through the composite film layer. The effect of blocking light is achieved by the half wave loss between the multiple film layers.

The half wave loss effect means that when light is emitted from an optically rarer medium with a lower refractive index to an optically denser medium with a higher refractive index, at the incident point of the light, a phase change occurs to the reflected light ray with respect to the incident light ray. The effect is equivalent to a part of the incident light ray is reflected, so that the remaining incident light ray enters the optically denser medium. The half wave loss only occurs when the light is emitted from the optically rarer medium to the optically denser medium, and does not occur when the light is emitted from the optically denser medium to the optically rarer medium.

In combination with the half wave loss principle, the composite film layer manufactured by the method for manufacturing the composite film layer of the present disclosure is employed, the first sub-film layer 11a and the second sub-film layer 11b having different refractive indices are deposited layer by layer, and during the sub-film deposition, the thicknesses of the sub-film layers are controlled by controlling the deposition durations of the first sub-film layers 11a and the second sub-film layers 11b, to achieve the purpose of blocking ultraviolet radiation in a predetermined wavelength.

In the method for manufacturing the composite film layer, the refractive index of the first sub-film layers 11a and the refractive index of the second sub-film layers 11b may be changed by selecting material of the first sub-film layers 11a and material of the second sub-film layers 11b. The thicknesses of the first sub-film layers 11a and the second sub-film layers 11b are changed by controlling the reaction process conditions, so that light in undesired wavelengths may be reflected, and in the present disclosure, ultraviolet radiation (wavelength <400 nm) is reflected. Therefore, an inorganic composite film layer functioning to block water, oxygen and ultraviolet radiation is prepared in the present disclosure.

Furthermore, the process for manufacturing the composite film layer in the present disclosure may be performed in the same chamber, which includes a chemical vapor deposition (CVD) chamber, an atomic layer deposition (ALD) chamber, and physical vapor deposition (PVD) chamber.

Preferably, Step S12 specifically includes controlling coating durations of the first sub-film layers 11a and the second sub-film layers 11b to make the thicknesses of the first sub-film layers 11a and the thicknesses of the second sub-film layers 11b increase or decrease in a gradient in a direction perpendicular to the composite film layer.

Preferably, the thicknesses of the first sub-film layers and the thicknesses of the second sub-film layers are all greater than 50 nm and less than 200 nm.

In Step S11, an absolute value of a difference between the refractive index of the first sub-film layer and the refractive index of the second sub-film layer is greater than or equal to 0.4.

Figure 3:
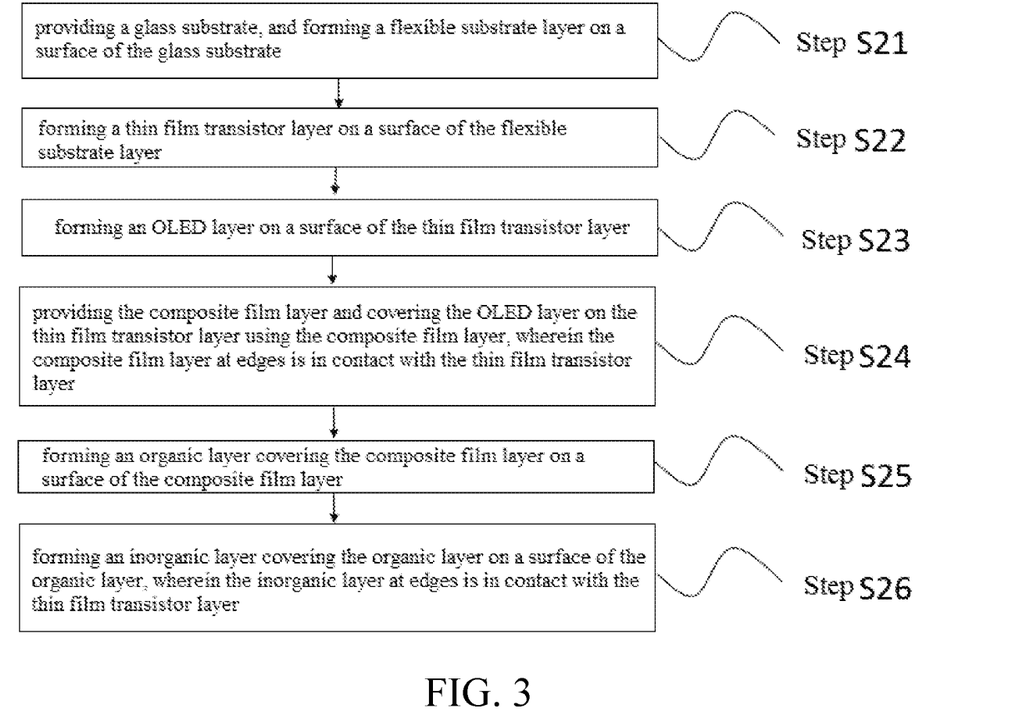
FIG. 3 is a schematic flowchart of a method for manufacturing an OLED display panel in accordance with an embodiment of the present disclosure.
Figure 5:
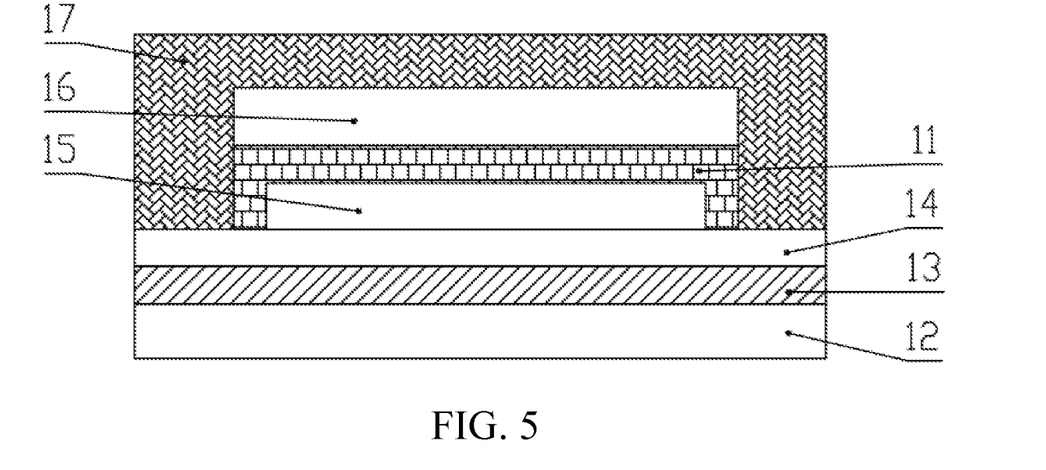
FIG. 5 is a structural schematic diagram of the OLED display panel in accordance with an embodiment of the present disclosure.
Figure 6:
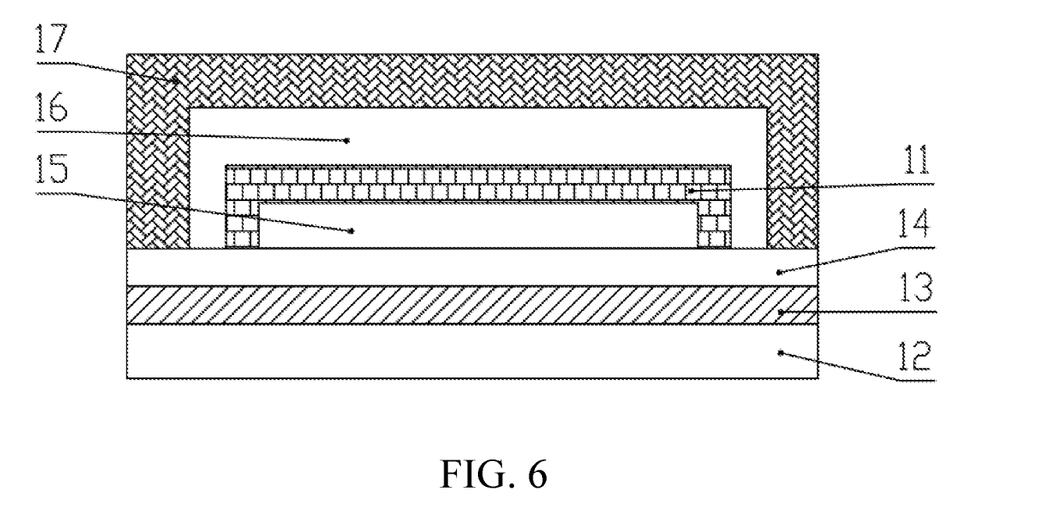
FIG. 6 is a structural schematic diagram of the OLED display panel in accordance with another embodiment of the present disclosure.

FIG. 3 is a schematic flowchart of a method for manufacturing an OLED display panel in accordance with an embodiment of the present disclosure. FIG. 4A-FIG. 4F are structural schematic diagrams of a method for manufacturing the OLED display panel in accordance with an embodiment of the present disclosure. FIG. 5 is a structural schematic diagram of the OLED display panel in accordance with an embodiment of the present disclosure. FIG. 6 is a schematic structural diagram of the OLED display panel in accordance with another embodiment of the present disclosure.

Figure 4A:
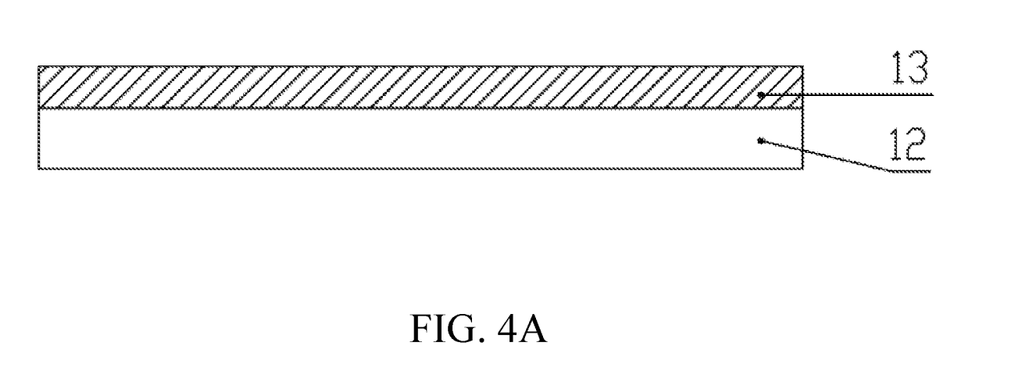
FIG. 4A-FIG. 4F are structural schematic diagrams of a method for manufacturing the OLED display panel in accordance with an embodiment of the present disclosure.

In accordance with another aspect of the present disclosure, a method for manufacturing an OLED display panel 1 is provided. The method for manufacturing the OLED display panel 1 includes the method for manufacturing the composite film layer 11 in accordance with the description above. The method for manufacturing the OLED display panel 1 includes:

Step S21: a glass substrate 12 is provided, and a flexible substrate layer 13 on the surface of the glass substrate 12 is formed, as shown in FIG. 4A.

Step S21 specifically includes providing the glass substrate 12, cleaning the glass substrate 12, and coating a polyimide liquid 13a on the surface of the glass substrate 12 by a polyimide coating machine. The flexible substrate layer 13 is formed after curing.

Figure 4B:
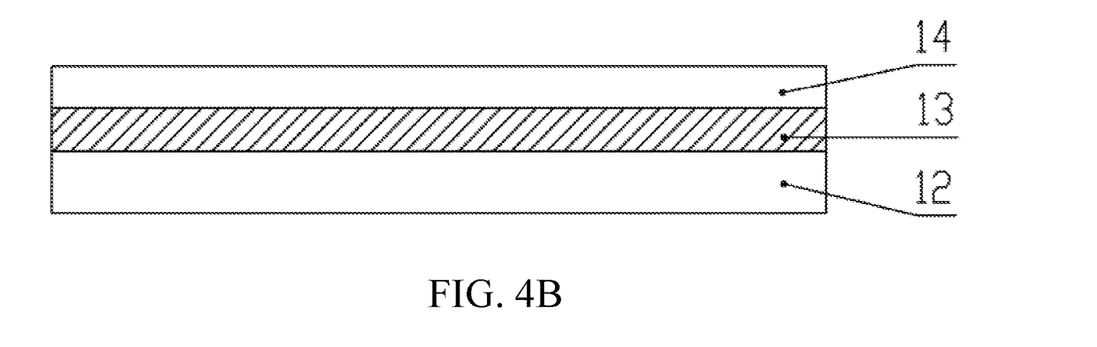

Step S22: a thin film transistor layer 14 is formed on the surface of the flexible substrate layer 13 by the process for manufacturing arrays, as shown in FIG. 4B. The thin film transistor layer 14 includes thin film transistors arranged in arrays.

Figure 4C:
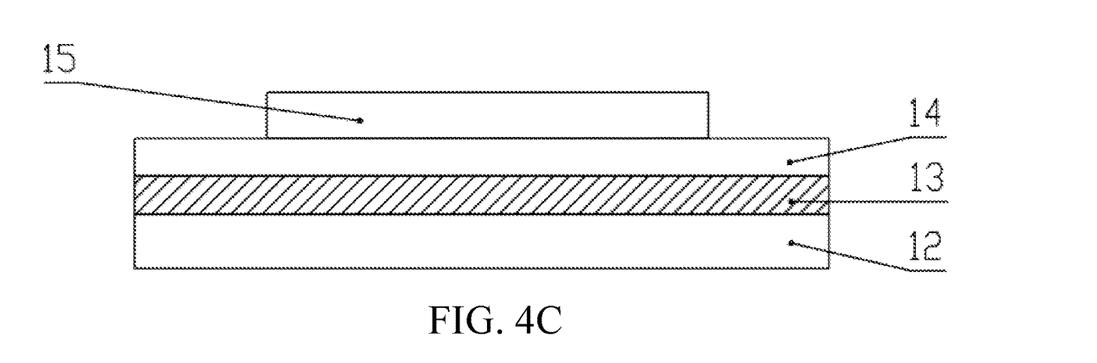

Step S23: an OLED layer 15 is formed on the surface of the thin film transistor layer 14 by a vacuum evaporation process, as shown in FIG. 4C.

The OLED layer 15 is composed of anodes, an organic layer and cathodes, wherein the anodes are composed of the layer structure of indium zinc oxide/silver/indium zinc oxide with high work functions and high reflectance. The organic layer includes a hole injection layer, a hole transport layer, a light-emitting layer, an electron transport layer and an electron injection layer. The cathode is composed of metal with a low work function, such as magnesium/silver alloy.

The organic layer in the OLED layer 15 is very sensitive to water, oxygen and ultraviolet radiation. Therefore, it is necessary to provide an encapsulation structure on the surface of the OLED layer 15.

Figure 4D:
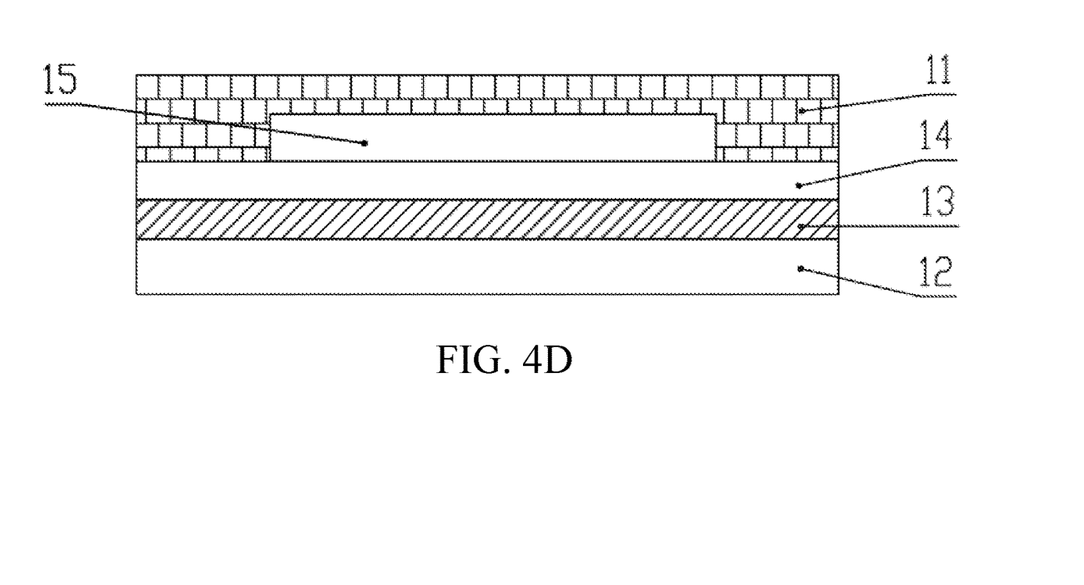

Step S24: the composite film layer 11 is formed on the thin film transistor layer 14, by a CVD process, an ALD process or a PVD process. The composite film layer 11 completely covers the OLED layer 15 on the thin film transistor layer. The composite film 11 layer at edges is directly in contact with the thin film transistor layer 14.

The method for manufacturing the composite film layer 11 in Step S24 includes:

Step S11: first sub-film layers 11a and second sub-film layers 11b are selected, wherein a refractive index of the first sub-film layers 11a is different from a refractive index of the second sub-film layers 11b.

Specifically, there are three different embodiments for the first sub-film layers 11a and the second sub-film layers 11b.

In an embodiment, neither the first sub-film layers 11a nor the second sub-film layers 11b have inorganic layer films.

Furthermore, material of the first sub-film layers 11a is silicon nitride. The refractive index of the silicon nitride is 1.7 to 1.9. Material of the second sub-film layers 11b is silicon oxide. The refractive index of silicon nitride is 1.3. to 1.5.

In another embodiment, the first sub-film layers 11a and the second sub-film layers 11b are both inorganic layer films.

In still another embodiment, the first sub-film layers 11a are organic layer films, and the second inorganic layer 11b are inorganic layer films.

When any of the sub-film layers included in the composite film layers 11 is an inorganic layer film, the composite film layer 11 not only functions to block ultraviolet radiation, but also realizes blocking water and oxygen due to the effective resistance of the inorganic layer to water and oxygen, thereby further realizing the protection of the OLED layer. Certainly, the composite film layer 11 includes an inorganic film layer, but is not limited to inorganic film layer, due to the factors, such as material.

Step S12: Coatings of the first sub-film layers and coatings of the second sub-film layers are alternately deposited and stacked to prepare the composite film layer.

Thicknesses of the first sub-film layers and thicknesses of the second sub-film layers gradually increase or decrease from top to bottom.

Figure 4E:
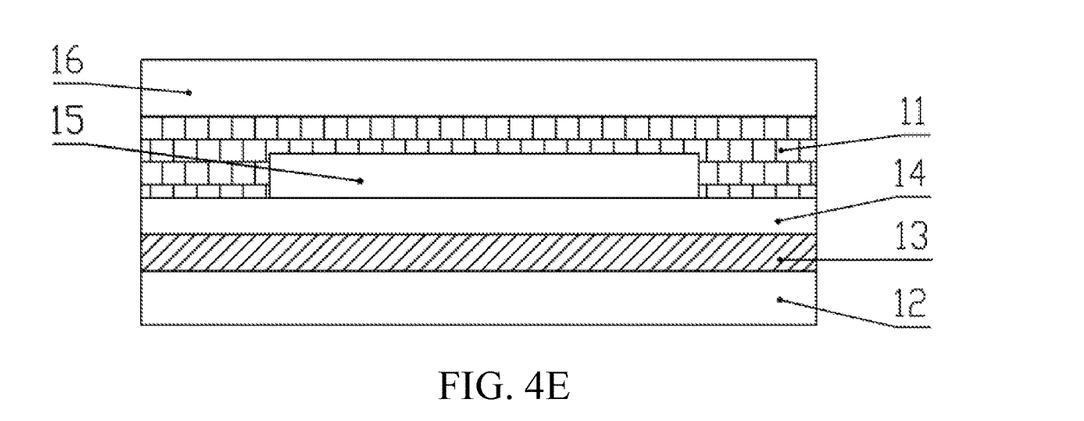

Step S25: an organic layer 16 is formed on the surface of the composite film layer 11, as shown in FIG. 4E.

Furthermore, the organic layer 16 is formed on the surface of the composite film layer 11 by a jet printing process or a chemical vapor deposition process.

It should be understood that the organic layer 16 may also be considered as a buffer layer, which functions as: (1) enclosing large particle foreign matters in the process for manufacturing the OLED display panel, (2) planarizing the surface of the composite film layer; and (3) releasing the stress between the composite film layer 11 and the inorganic layer 17.

Figure 4F:
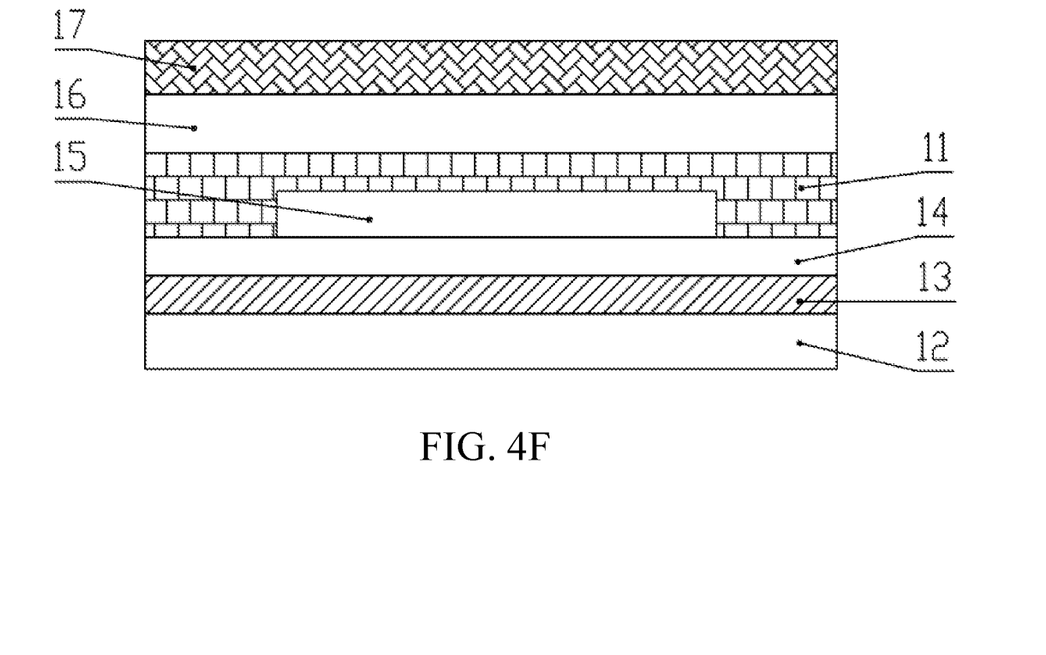

Step S26: an inorganic layer 17 is formed on the surface of the organic layer 16 by an ALD process, a CVD process, or a PVD process, as shown in FIG. 4F. The inorganic layer 17 completely covers the organic layer 16. The inorganic layer 16 at edges is directly in contact with the thin film transistor layer 13.

The inorganic layer serves as the outermost portion of the encapsulation structure of the OLED display panel 1 and functions to directly block outside water and oxygen from entering the OLED display panel 1.

In an embodiment, as shown in FIG. 5, in Step S25, the organic layer 16 is formed on the upper surface of the composite film layer.

In another embodiment, as shown in FIG. 6, in Step S25, the organic layer 16 completely covers the composite film layer 11, and the organic layer 16 at edges is directly in contact with the thin film transistor layer 14.

The present disclosure provides the composite film layer, the method for manufacturing the same, and the method for manufacturing the OLED display panel. The resistance of the OLED display panel to ultraviolet radiation is improved by preparing the novel composite film layer having the function of blocking ultraviolet radiation, thereby improving the product quality of the OLED display panel.

In summary, although the preferable embodiments of the present disclosure have been disclosed above, the embodiments are not intended to limit the present disclosure. A person of ordinary skill in the art, without departing from the spirit and scope of the present disclosure, can make various modifications and variations. Therefore, the scope of the disclosure is disposed in the claims.

What is claimed is:

1. A composite film layer, comprising:
first sub-film layers and second sub-film layers, wherein a refractive index of the first sub-film layers is different from a refractive index of the second sub-film layers, the first sub-film layers and the second sub-film layers are alternately stacked, and thicknesses of the first sub-film layers and thicknesses of the second sub-film layers gradually increase or decrease in a direction perpendicular to the composite film layer, wherein the first sub-film layers and the second sub-film layers are both organic layers.

2. The composite film layer as claimed in claim 1 wherein the thicknesses of the first sub-film layers and the thicknesses of the second sub-film layers are all greater than 50 nm and less than 200 nm.

3. The composite film layer as claimed in claim 1, wherein an absolute value of a difference between the refractive index of the first sub-film layer and the refractive index of the second sub-film layer is greater than or equal to 0.4.

4. A composite film layer, comprising:
first sub-film layers and second sub-film layers, wherein a refractive index of the first sub-film layers is different from a refractive index of the second sub-film layers, the first sub-film layers and the second sub-film layers are alternately stacked, and thicknesses of the first sub-film layers and thicknesses of the second sub-film layers gradually increase or decrease in a direction perpendicular to the composite film layer wherein the first sub-film layers are organic layers and the second sub-film layers are inorganic layers.

5. The composite film layer as claimed in claim 4, wherein the thicknesses of the first sub-film layers and the thicknesses of the second sub-film layers are all greater than 50 nm and less than 200 nm.

6. The composite film layer as claimed in claim 4, wherein an absolute value of a difference between the refractive index of the first sub-film layer and the refractive index of the second sub-film layer is greater than or equal to 0.4.

* * * * *